(12) United States Patent
Durupt et al.

(10) Patent No.: US 12,317,420 B2
(45) Date of Patent: May 27, 2025

(54) SENSOR WITH PRINTED CIRCUIT BOARD BASED CONTACT

(71) Applicant: MEAS France, Toulouse (FR)

(72) Inventors: Emilien Durupt, Toulouse (FR); Yannick Vidal, Toulouse (FR); Vincent Leger, Toulouse (FR)

(73) Assignee: MEAS France, Toulouse (FR)

( * ) Notice: Subject to any disclaimer, the term of this patent is extended or adjusted under 35 U.S.C. 154(b) by 374 days.

(21) Appl. No.: 17/865,784

(22) Filed: Jul. 15, 2022

(65) Prior Publication Data
US 2023/0016596 A1 Jan. 19, 2023

(30) Foreign Application Priority Data

Jul. 19, 2021 (EP) ...................... 21306013

(51) Int. Cl.
*H05K 1/18* (2006.01)
*G01K 1/14* (2021.01)

(52) U.S. Cl.
CPC ............... *H05K 1/181* (2013.01); *G01K 1/14* (2013.01); *H05K 1/189* (2013.01); *H05K 2201/10151* (2013.01)

(58) Field of Classification Search
CPC ........ H05K 1/028; H05K 1/181; H05K 1/189; H05K 2201/09263; H05K 2201/10151; G01K 1/14
See application file for complete search history.

(56) References Cited

U.S. PATENT DOCUMENTS

| | | | |
|---|---|---|---|
| 2007/0093084 A1 | 4/2007 | Chen | |
| 2008/0105455 A1* | 5/2008 | Palfreyman | H05K 1/0271 29/829 |
| 2008/0212645 A1* | 9/2008 | Mau | G01K 1/16 374/E1.019 |
| 2020/0408607 A1 | 12/2020 | Yee | |
| 2021/0102845 A1* | 4/2021 | Vidal | H05K 3/403 |
| 2023/0021547 A1* | 1/2023 | Muehlhausen | H05K 1/181 |

FOREIGN PATENT DOCUMENTS

| | | | | |
|---|---|---|---|---|
| DE | 102011004174 A1 * | 8/2012 | ........... | H05K 1/0278 |
| WO | 2020105881 A1 | 5/2020 | | |

OTHER PUBLICATIONS

Extended European Search Report, Application No. 21306013.0-1001, Dated: Dec. 7, 2021, 9 pages.

\* cited by examiner

*Primary Examiner* — Nathan Milakovich
(74) *Attorney, Agent, or Firm* — Barley Snyder

(57) ABSTRACT

A sensor includes a printed circuit board having a first region and a second region linked together by a flexible linking portion. A free end portion of the first region opposite the flexible linking portion is movable with respect to the second region. The flexible linking portion is part of the printed circuit board.

21 Claims, 3 Drawing Sheets

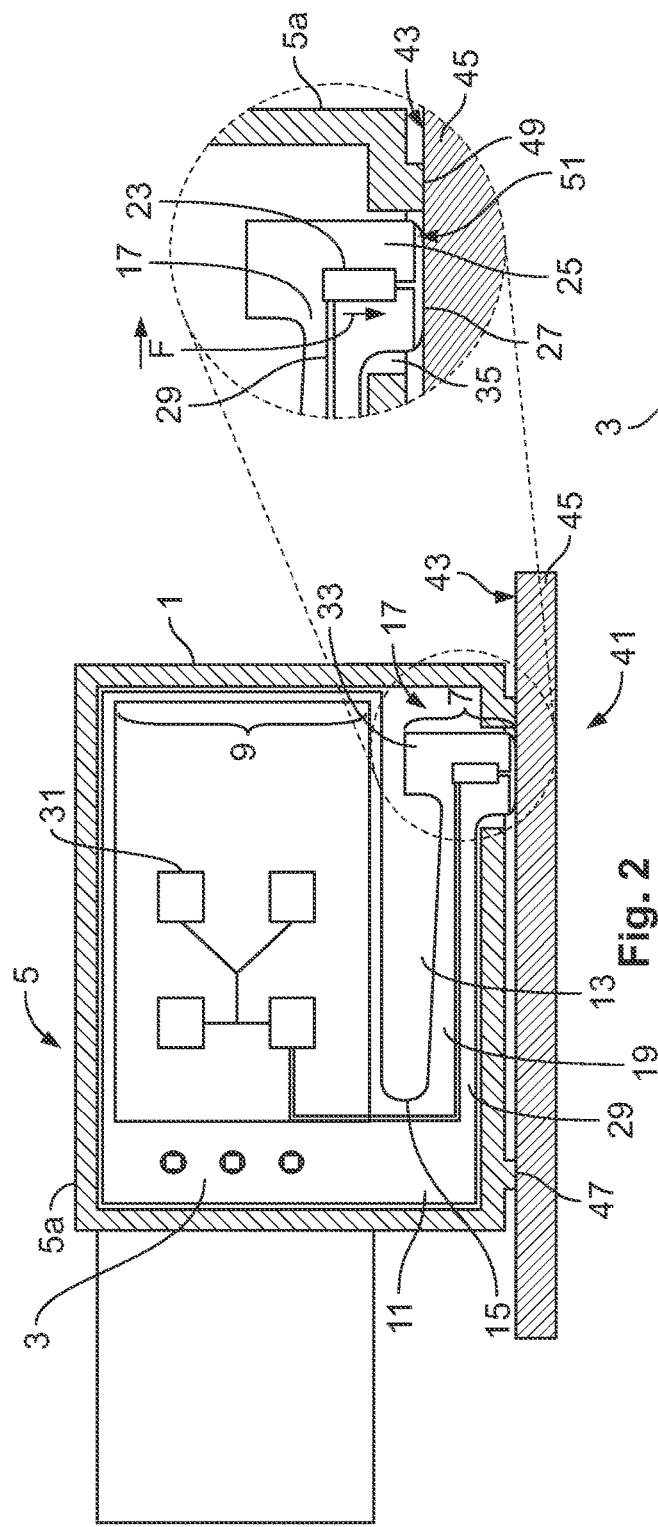
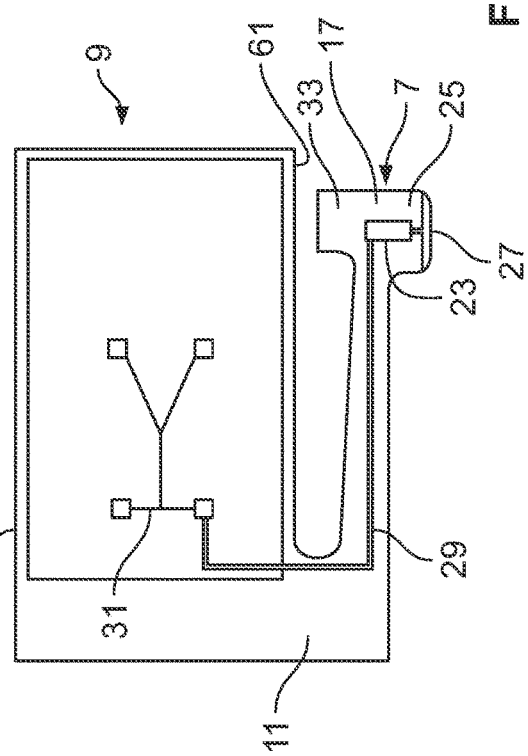

SENSOR WITH PRINTED CIRCUIT BOARD BASED CONTACT

CROSS-REFERENCE TO RELATED APPLICATIONS

This application claims the benefit of the filing date under 35 U.S.C. § 119(a)-(d) of European Patent Application No. 21306013.0, filed on Jul. 19, 2021.

FIELD OF THE INVENTION

The invention relates to a sensor comprising a printed circuit board with a parameter sensing element.

BACKGROUND

To sense a physical parameter of a probe, the sensing element of certain sensors needs to be in safe and reliable physical contact with the probe. This is particularly the case for thermal sensors that comprise a temperature sensing element mounted on a printed circuit board that is encapsulated in a housing. They are widely used to determine the temperature of a probe or device. For instance, thermal sensors find their application in vehicles to measure the temperature of various parts. As an example, thermal sensors are used to measure the temperature of a windscreen to preview the risk of fogging or icing and to provide suitable control signals to the air conditioning system.

To function properly, a stable thermal contact is needed between the temperature sensing element of the thermal sensor and the surface to be temperature probed. In the prior art sensor devices, this is achieved using additional parts such as thermally conductive pads attaching the sensor to the surface, or flexing elements, like springs, that push the temperature sensing element against the surface to be measured. That is a need for an alternative solution that ensures the contact of a sensor with the surface to be probed without an additional part.

SUMMARY

A sensor includes a printed circuit board having a first region and a second region linked together by a flexible linking portion. A free end portion of the first region opposite the flexible linking portion is movable with respect to the second region. The flexible linking portion is part of the printed circuit board.

BRIEF DESCRIPTION OF THE DRAWINGS

The invention will now be described by way of example with reference to the accompanying Figures, of which:

FIG. 2 is a sectional side view of the temperature sensor mounted to an object to be sensed;

FIG. 3 is a side view of a printed circuit board of the temperature sensor; and

DETAILED DESCRIPTION OF THE EMBODIMENT(S)

Features and advantages of the present invention will be described with reference to the drawings. In the description, reference is made to the accompanying figures that are meant to illustrate embodiments of the invention. It is understood that such embodiments do not represent the full scope of the invention.

Figure 1:
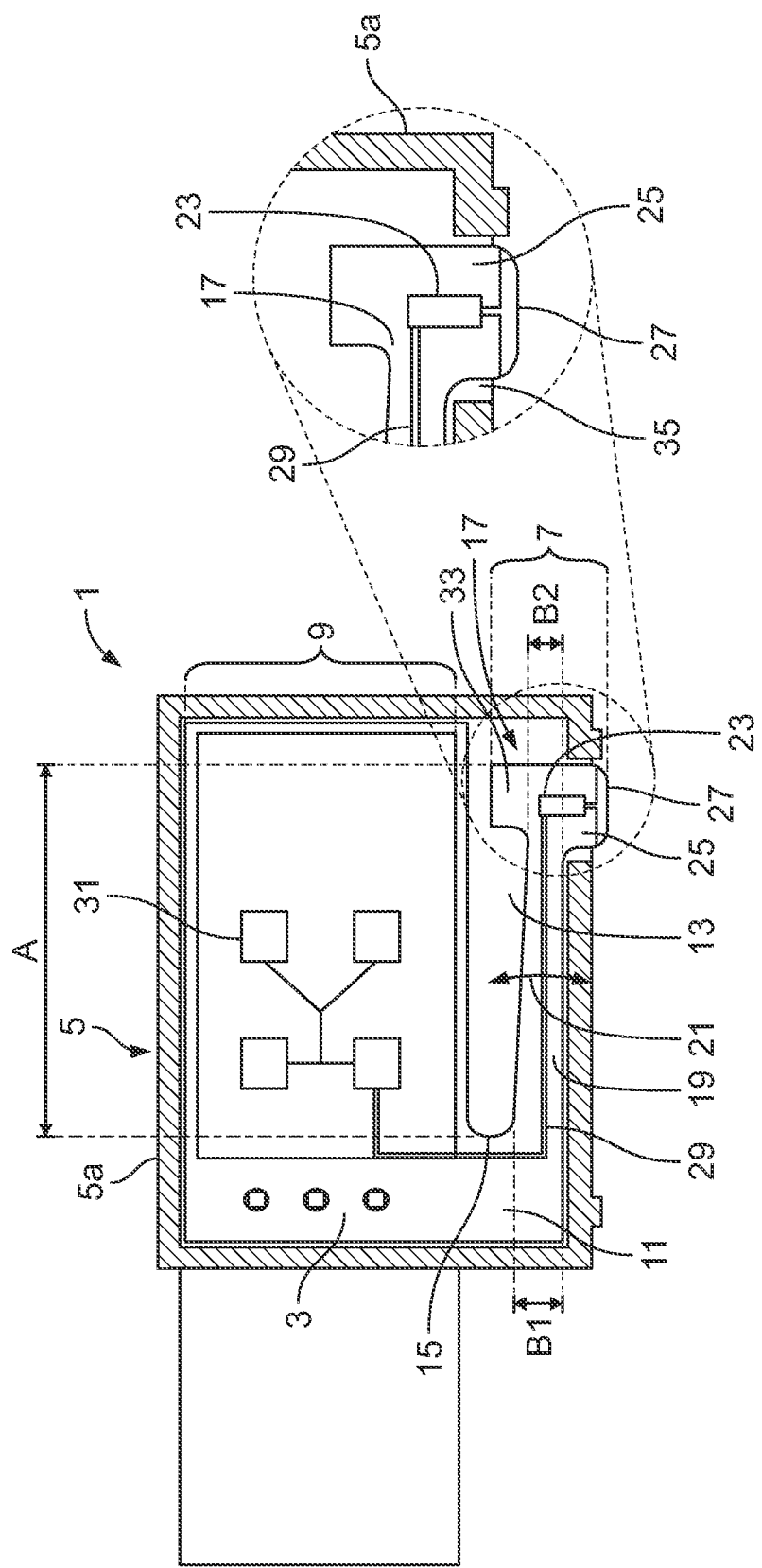
FIG. 1 is a sectional side view of a temperature sensor according to an embodiment.

FIG. 1 illustrates a first embodiment of a sensor according to the invention. The invention will be described in detail for a temperature sensor 1. Nevertheless, the concept of ensuring a reliable contact between the sensor 1 and the surface to be probed can be applied to other kinds of sensors sensing one or more other physical parameters.

The temperature sensor 1 comprises a printed circuit board 3 positioned inside a housing 5. FIG. 1 illustrates a view onto one main surface of the printed circuit board 3 placed into the housing 5, which is illustrated with a cut view through its lateral walls 5a. In FIG. 1, the temperature sensor 1 is not yet mounted to an object to be sensed.

As shown in FIG. 1, the printed circuit board 3 comprises a first region 7 and second region 9 which are spaced apart from each other on one side and linked together via a flexible linking portion 11. According to the invention, the flexible linking portion 11 is an integral part of the printed circuit board 3.

To form the flexible linking portion 11, a cut-out region 13 is provided in the printed circuit board 3. The cut-out region 13 is realized such that the flexible linking portion 11 comprises an area 15 with a concavely rounded shape to facilitate the flexing described below.

The first region 7 comprises a head portion 17 and an arm portion 19 linking the head portion 17 at the end of the first region 7 to the flexible linking portion 11, as shown in FIG. 1. The head portion 17 at the extremity of the first region 7, also called the free end portion, is thus opposite to the flexible linking portion 11.

The cut-out region 13 mechanically weakens the printed circuit board 3 and provides the necessary elasticity so that the head portion 17 at the extremity of first region 7 can be flexed and moved relatively to the second region 9 in the plane formed by the printed circuit board 3. In other words, the first region 7 behaves like a spring, indicated by arrow 21. The mechanical principle can be realized with many materials. The printed circuit board 3 can e.g. be made of the widely used FR4 epoxy laminate (Fiber Reinforced 4), but could also be made of any other suitable material like phenolic resins. The dimensions of the cut out region 13 and the material used determine the resulting forces and the vibratory resistance. The Young modulus of the material may be in a range of 2 GPa to 300 GPa. The needs of heat dissipation and conduction can also be taken into account.

As shown in FIG. 1, the head portion 17 comprises a temperature sensing element 23, e.g. in the form of a thermistor, like a negative temperature coefficient (NTC) thermistor.

The head portion 17 has a first protruding region 25 in the plane of the printed circuit board 3 that is protruding away from the second region 9 and comprises a metallized edge region 27. The temperature sensing element 23 is in thermal contact with the metallized edge region 27, which faces away from the second region 9. By arranging the metallized edge region 27 on the side away from the second region 9, the access to the metallized edge region 27 is simplified so that a reliable thermal contact can be realized with any object.

According to an embodiment, the metallized edge region 27 can be positioned at an extremity of the first region 7 opposite the flexible linking portion 11. At the extremity of the first region 7 opposite the flexible linking portion 11, the elastic forces occurring following a deformation are higher than in regions closer to the flexible linking portion 11.

The temperature sensing element 23 is electrically connected via a metallic track 29 to one or more electrical components 31 provided on the second region 9 of the printed circuit board 3. By spatially separating the thermistor 23 from the other electrical components 31 of the temperature sensor 1, the temperature sensing is less disturbed by heat of the electrical components 31. The temperature sensing element 23 may also be referred to as a physical parameter sensing element 23 due to the usability of the sensor 1 in applications sensing physical parameters including but not limited to temperature.

The head portion 17 furthermore comprises a second protruding region 33 in the plane of the printed circuit board 3 that is protruding towards the second region 9 and serves as a stopping element limiting the course of movement of the head portion 17 towards the second region 9, as will be described in greater detail below.

The enlarged zone in FIG. 1 illustrates that the first protruding portion 25 of the head portion 17 of the first region 7 of the printed circuit board 3 extends at least partially through and beyond a through hole 35 in the housing 3 enclosing the remainder of the printed circuit board 3.

In this embodiment, the metallized edge region 27 extends beyond the through hole 35 in the housing 3 towards the outside.

In an embodiment, the length A of the first region 7, thus the length of the head portion 17 plus the arm portion 19 as illustrated in FIG. 1, can be larger than a width B1 of first region 7, thus the arm portion 19, at the transition to the flexible linking portion 11. In an embodiment, the length A should satisfy A>3*B1. In an embodiment, the arm portion 19 has a tapered shape, such that the width B1, perpendicular to the length A, of the arm portion 19 at the transition to the flexible linking portion 11 is larger than the width B2 at the transition to the head portion 17 to distribute the mechanical stress over the length of the arm portion 19.

FIG. 2 illustrates a device 41 comprising the temperature sensor 1 of the first embodiment. In the device 41, e.g. a vehicle, the temperature sensor 1 is mounted to a surface 43 of an element 45 of the device. As an example, the element 45 can be the windscreen of a vehicle and the temperature sensor 1 is mount onto the inside surface 43 of the windscreen. Features with reference numerals already used in the description of the temperature sensor 1 illustrated in FIG. 1 will not be described again in detail, but reference is made to their description in FIG. 1.

When mounting the temperature sensor 1 onto the surface 43, the feet 47 and 49 of the housing 5 rest on the surface 43. Mounting can be realized in several ways, e.g. by gluing, clipping using a spring element to hold the sensor 1 in place or by locking the sensor 1 using an additional locking element. During the step of mounting of the temperature sensor 1, the first protruding portion 25 of the first region 7 is pushed towards the housing 5 such that the extremity 51 of the metallized edge regions 27 becomes flush aligned with the extremity of the foot 49. This becomes possible due to the elasticity of the arm portion 19 of first region 7. Due to elastic property of the first region 7, the extremity 51 of the metallized edge region 27 is pressed against the surface 43 by the elastic restoring force, illustrated by arrow F in FIG. 2. In other words, the head portion 17 of the first region 7 is in a preloaded state. Thus, the thermal contact between the metallized edge region 27 and the element 45 to be temperature sensed can be ensured in a simple and reliable manner.

Thus, due to the flexible shape design of the printed circuit board 3 made out of an intrinsically flexible material, a preloaded thermal contact can be ensured between the temperature sensor 1 and the object to be sensed. This thermal contact can thus be realized without the need of any additional elements like additional springs, flex elements or thermal pads, thereby reducing cost of manufacturing and reducing the bill of materials.

FIG. 3 illustrates the printed circuit board 3 according to the invention before being mounted into a housing 5 as shown in FIGS. 1 and 2. The printed circuit board 3 of FIG. 3 has all the features of the printed circuit board as already described with respect to FIGS. 1 and 2 to which reference is made. The second protruding portion 33 reduces risk of breakage of the printed circuit board 3 as the travel of the head portion 17 towards the second region 9 can be kept small. Indeed, the movement of the head portion 17 at the end portion of the first region 7 is stopped when the second protruding region 33 touches the edge 61 of the second region 9.

In FIG. 3, the printed circuit board 3 is illustrated with all elements mounted, e.g. the temperature sensing element 23, the electrical components 31 and the electrically and thermally conductive traces 29, 27. The invention is, however, not limited thereto and also relates to the printed circuit board 3 alone.

Figure 4:
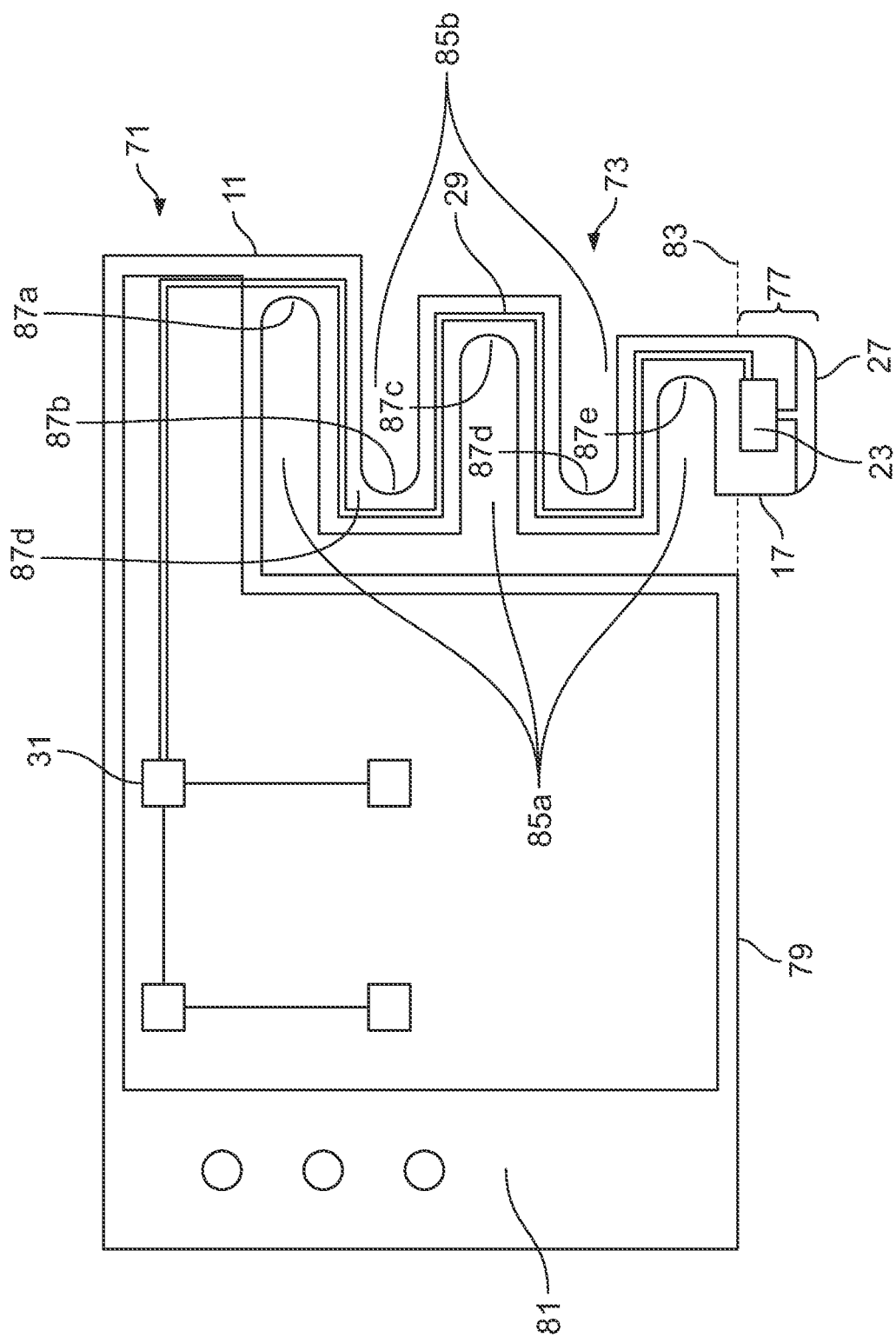
FIG. 4 is a side view of a printed circuit board according to another embodiment of the invention.

FIG. 4 illustrates a third embodiment according to the invention. The printed circuit board 71 according to the third embodiment has a first region 73 that is zigzag shaped between the flexible linking portion 11 and the head portion 17 instead of using an arm shaped portion 19 like in the first and second embodiment. Features carrying the same reference numerals as already used in the first and second embodiment will not be described again in detail but reference is made thereto.

In the embodiment of FIG. 4, the zig zag shaped first region 73 is realized by a succession of U-shaped elements, which is an example shape only. Other shapes, like V-shaped elements or alternating U and V shape elements could also build up the first region 73.

The head portion 17 comprises a protruding portion 77 extending beyond edge 79 of the second region 81 of the printed circuit board 71, which is indicated by the dotted lines 83. At the extremity of the protruding portion 77 farthest away from the flexible linking portion 11, a metalized edge region 27 is provided like in the first and second embodiment. The metalized edge region 27 is in thermal contact with the temperature sensing element 23 in turn electrically connected via the electrical connection 29 with further electrical elements 31 provided on the second region 81.

The cut outs 85a and 85b to remove printed circuit board material and mechanically weaken the printed circuit board 72 to obtain the shape as illustrated in FIG. 4 are realized such that the corners on the inner sides 87a-e of the U-shaped elements all have rounded shapes.

The printed circuit board 75 can be positioned in a housing 5 like in the first embodiment such that the metallized edge region 27 extends beyond the through hole 35. In the mounted state, the metallized edge region 27 can be pushed towards the inside of the housing 5 comparable to what is illustrated in FIG. 2 which is due to the spring like behavior of the zig zag shaped first region 73 and the flexible linking portion 11. Thus, the same advantages can be achieved with the printed circuit board 71 of the third embodiment like with the printed circuit board 3 as illustrated in FIG. 3.

A number of embodiments of the invention have been described. Nevertheless, it is understood that various modifications and enhancements may be made without departing from the following claims.

What is claimed is:

1. A sensor, comprising:
a printed circuit board having a first region and a second region linked together by a flexible linking portion, a free end portion of the first region opposite the flexible linking portion is movable with respect to the second region, the first region has a first protruding region in a plane of the printed circuit board that protrudes away from the second region, the flexible linking portion is part of the printed circuit board.

2. The sensor of claim 1, wherein the printed circuit board has a cutout region between the first region and the second region that forms the flexible linking portion.

3. The sensor of claim 1, wherein the first region has a metallized edge region.

4. The sensor of claim 3, wherein the metallized edge region is on a side of the first region facing away from the second region.

5. The sensor of claim 4, wherein the metallized edge region is positioned at the free end portion of the first region opposite the flexible linking portion.

6. The sensor of claim 3, wherein the first protruding region has the metallized edge region.

7. The sensor of claim 6, wherein the first region has a second protruding region in the plane of the printed circuit board that protrudes toward the second region.

8. The sensor of claim 1, wherein the first region is zigzag shaped.

9. The sensor of claim 1, further comprising a housing in which the printed circuit board is disposed.

10. The sensor of claim 9, wherein the first region of the printed circuit board extends at least partially through and beyond a through hole in the housing.

11. The sensor of claim 10, wherein the first region has a metallized edge region extending beyond the through hole in the housing.

12. The sensor of claim 1, wherein the flexible linking portion allows a movement of the first region with respect to the second region in a plane defined by the printed circuit board.

13. The sensor of claim 1, wherein a length of the first region extending from the flexible linking portion to an extremity of the free end portion is larger than a width of the first region at an intersection of the first region with the flexible linking portion.

14. The sensor of claim 1, wherein the first region has an arm region between the flexible linking portion and the free end portion, the arm region has a tapered shape.

15. The sensor of claim 1, further comprising a physical parameter sensing element disposed on the printed circuit board.

16. The sensor of claim 15, wherein the sensor is a temperature sensor and the physical parameter sensing element is a temperature sensing element.

17. The sensor of claim 16, wherein the temperature sensing element is a thermistor disposed on the first region.

18. The sensor of claim 17, wherein the thermistor is electrically connected to an electrical component disposed on the second region.

19. A printed circuit board, comprising:
a first region having a first protruding region in a plane of the printed circuit board;
a second region, the first protruding region protrudes away from the second region; and
a flexible linking portion linking the first region and the second region, a free end portion of the first region opposite the flexible linking portion is movable with respect to the second region, the flexible linking portion is part of the printed circuit board.

20. A device, comprising:
an element having a surface; and
a sensor mounted to the surface, the sensor has a housing and a printed circuit board disposed in the housing, the printed circuit board has a first region and a second region linked together by a flexible linking portion, a free end portion of the first region opposite the flexible linking portion is movable with respect to the second region, the first region has a first protruding region in a plane of the printed circuit board that protrudes away from the second region, the flexible linking portion is part of the printed circuit board, the housing is positioned with respect to the element to have the first region in a preloaded state and pressed against the surface of the element.

21. A sensor, comprising:
a printed circuit board having a first region and a second region linked together by a flexible linking portion, a free end portion of the first region opposite the flexible linking portion is movable with respect to the second region, the first region has an arm region between the flexible linking portion and the free end portion, the arm region has a tapered shape, the flexible linking portion is part of the printed circuit board.

* * * * *